(12) United States Patent
Martin

(10) Patent No.: US 11,271,517 B2
(45) Date of Patent: Mar. 8, 2022

(54) PHOTOVOLTAIC-BASED SOLAR TRACKING SYSTEM FOR SOLAR CONCENTRATOR

(71) Applicant: Herbert Martin, Paducah, KY (US)

(72) Inventor: Herbert Martin, Paducah, KY (US)

( * ) Notice: Subject to any disclaimer, the term of this patent is extended or adjusted under 35 U.S.C. 154(b) by 513 days.

(21) Appl. No.: 16/444,477

(22) Filed: Jun. 18, 2019

(65) Prior Publication Data

US 2020/0403558 A1 Dec. 24, 2020

(51) Int. Cl.
*H02S 20/32* (2014.01)
*F24S 23/71* (2018.01)
*H01L 31/054* (2014.01)
*F24S 20/20* (2018.01)

(52) U.S. Cl.
CPC ............. *H02S 20/32* (2014.12); *F24S 23/71* (2018.05); *H01L 31/0547* (2014.12); *F24S 2020/23* (2018.05)

(58) Field of Classification Search
CPC ...... H02S 20/32; H01L 31/0547; F24S 23/71; F24S 2020/23
See application file for complete search history.

(56) References Cited

U.S. PATENT DOCUMENTS

| | | | |
|---|---|---|---|
| 4,021,267 A | 5/1977 | Dettling | |
| 4,204,881 A | 5/1980 | McGrew | |
| 4,350,837 A | 9/1982 | Clark | |
| 6,276,359 B1 | 8/2001 | Frazier | |
| 6,532,953 B1 | 3/2003 | Blackmon et al. | |
| 7,171,812 B2 | 2/2007 | Schubert | |
| 2013/0319508 A1* | 12/2013 | Sinclair | F24S 30/452 136/246 |
| 2020/0036324 A1* | 1/2020 | Obeto | H02S 20/32 |

* cited by examiner

*Primary Examiner* — Que Tan Le
*Assistant Examiner* — Don J Williams
(74) *Attorney, Agent, or Firm* — Stockwell & Smedley, PSC

(57) ABSTRACT

A solar tracking system preferably associated with a double-reflecting dish solar concentrator having an initial parabolic reflective surface for concentrating solar energy upon a focal cloud preferably spatially coinciding with the primary focus of a subsequent elliptical reflective surface for further concentrating solar energy within a beam directed through an opening defined, preferably at the origin, by the initial parabolic reflective surface to heat a thermal transfer fluid flowing through a heating element; said subsequent elliptical reflective surface having a photovoltaic element on its reverse; said photovoltaic element being divided into plural sections, preferably quadrants, from which respective photovoltaic-based voltmeter readings are utilized to reposition the initial parabolic reflective surface's axis of symmetry closer to parallel with the plurality of incoming solar energy thereby effectively tracking the sun and maximizing collectable/concentrated solar energy.

20 Claims, 5 Drawing Sheets

PHOTOVOLTAIC-BASED SOLAR TRACKING SYSTEM FOR SOLAR CONCENTRATOR

FIELD OF THE INVENTION

The present invention relates to a solar tracking system relying upon differences in photovoltaic-based voltages to enhance tracking of the sun by a solar concentrator.

BACKGROUND OF THE INVENTION

Various systems concentrate and collect solar energy by exploiting the sensible and/or latent heat characteristics of a thermal heat storage medium. Such systems often include a solar concentrator utilizing at least an initial parabolic reflective surface to concentrate solar energy ("hv") within the overall electromagnetic spectrum. Such solar concentrators often heat a thermal transfer fluid consisting of a fluid/fluidizable thermal heat storage medium flowing through transport conduit to a subsequent location to have stored thermal energy (serially) relinquished to other materials and/or converted to a more desirable energy forms (e.g., electrical energy generated by a steam turbine).

On a macroscale, the majority/plurality of solar energy rays generally travel in a relatively straightline path from the sun to an initial parabolic reflective surface of the solar concentrator (i.e., "direct radiation" versus "diffuse sunlight" and/or "reflected radiation" for which the directional pathway from the sun has been significantly altered). One way to increase solar energy concentrated/stored is to ensure that the axis of symmetry of the initial parabolic reflective surface of a solar collector is oriented parallel to a plurality of incoming solar energy rays as increasing deviation from parallelity will generally decrease the overall amount of reflected/concentrated solar energy rays.

Various methods exist for decreasing derivations from parallelity of the axis of symmetry with incoming solar energy rays as the sun's apparent position changes in the sky throughout the day/year. However, some solar concentrators simply do not employ a solar tracker for periodically/continually re-orientating the solar concentrator to decrease deviations from parallelity, but rather fix the solar concentrator in a set position generally facing south in the Northern Hemisphere (and generally facing north in the Southern Hemisphere) with altitudinal orientation being set at a best average position based upon parameters such as the latitudinal location of the solar energy focuser thereby taking into account the sun's altitudinal change throughout the day and the year. Such non-tracking systems simply tolerate any loss of solar power related to failure to further decrease deviations from parallelity. Single-axis trackers generally have only one degree of freedom—for example in the case of a horizontal single axis tracker, the system may actively tracks the sun's azimuth from east to west throughout the day, with the altitudinal related orientation being relatively set. Double-axis trackers have two degrees of freedom, often with the ability to actively make both altitudinal and azimuthal adjustments throughout the day/year.

Single-axis and double-axis trackers often rely upon electronic tables, variable data input, and/or associated calculations to predict/determine the apparent position of the sun for a given position on Earth at a given time of day/year. However usage of said tables, variable data inputs, and/or associated calculations can be interrupted and/or erroneous (e.g., due to power supply interference or manufacturer/user errors). Also the cost of solar tracker technology has generally not decreased at the same rate as overall solar technology, meaning that the percentage cost for the solar tracker technology has generally increased over time. The solar energy industry needs improvements and alternatives to existing technology for solar trackers.

Accordingly, for the above reasons and others, there is a need in the industry for improved solar trackers.

SUMMARY OF THE INVENTION

The invention is generally directed to systems and methods which address the issues cited above as well as other issues.

For example, some embodiments of the invention are directed to a solar tracker system associated or integrated with a solar concentrator including an initial parabolic reflective surface, preferably a parabolic mirror, for concentrating solar energy rays at a focal cloud where it can be further manipulated or utilized immediately to do work [e.g., heat a thermal transfer fluid which can be conducted elsewhere and go through (a series) of energy changes before ultimately being used to generate a more preferable energy form such as electrical energy produced by a steam turbine]. The solar tracker system includes a sectioned photovoltaic element preferably situated in the parabolic reflective surface's axis of symmetry near the initial parabolic reflecting surface's focal cloud with an orientation perpendicular to the axis of symmetry but facing away from the parabolic origin [e.g., an end cap maintained upon some supportive element (s) near the focal cloud]. The solar tracker system includes means (e.g., voltmeters) for measuring which section(s) has/have the highest associated electrical potential difference indicating that/those section(s) are likely receiving more sunlight because the axis of symmetry for the parabolic reflective surface is not pointing directly at the sun. The solar tracking system also includes means for adjusting the directionality of the initial parabolic reflective surface (e.g., tilting the section of highest associated electrical potential difference away from the sun with the opposing side of the parabolic reflective surface simultaneously tilting towards the sun). Preferably, the means for adjusting will be based upon measurements and/or calculations in differences between measure electrical potential differences between/amongst the sectioned photovoltaic device.

In some embodiments the supportive element(s) near the focal cloud maintaining the sectioned photovoltaic device are four symmetrical spaced support arms traversing from a subsequent reflective surface, preferably an elliptical mirror, for further concentrating solar energy. Preferably this subsequent reflective surface reflects the concentrated solar energy through a hole defined by the initial parabolic reflective surface near its origin to be concentrated, preferably near a conjugate focal point for the subsequent elliptical reflective surface where the concentrated solar energy may be used to heat a heating element and its contents (e.g., flowing thermal transfer fluid entering and exiting the heating element via transport conduit). One potential thermal transfer fluid is water which may enter the heating element as liquid water but exit after heating as steam or superheated water; however, a multitude of substances may be used as thermal transfer fluid for the purposes of storing, moving, and/or releasing/transferring latent and sensible heat (e.g., any number of molten salts).

In some embodiments the heating element is comprised of high temperature materials such as tungsten that can withstand intense heat increases without melting. However, a multitude of substance may be used based upon their high melting temperature (e.g., a zirconium carbide).

In some embodiments the heating element defines a partially hollowed sphere and is comprised of a cupola connected or integral with the initial parabolic reflective surface or its associated backing. The cupula defines a hole through which concentrated solar energy reflected from the subsequent reflective surface may pass into the heating element to strike a hot spot which is part of a base element with rounded sides—portions of which are in intimate contact with the rounded cupola and upon which the cupola is seated. The hot spot becomes heated by the concentrated solar energy and conducts that heat to thermal transfer fluid flowing through the heating element.

In some preferred embodiments, the heating elements includes corrugation, coiling, baffling, or other elements to increase surface area for transferring heat from the hot spot and its surroundings to the thermal transfer fluid. In preferred embodiments the heating element may include reflective and/or insulating material and/or be depressurized to prevent unwanted heat/energy loss to substances other than the thermal transfer fluid.

In some embodiments the sectioned photovoltaic device is dome-like in nature; in other embodiments it is pyramidal; in yet other embodiments it can be other shapes preferably having equal-sized sections for easier and more efficient comparison of voltage data.

In some embodiments the means for adjusting the directionality of the initial parabolic reflective surface include one or more adjustable gears or one or more adjustable screws. In still other embodiments the adjusting means include plural driven rollers which can drive a cupola thereby repositioning the cupola's integral/connected/associated initial parabolic reflective surface.

Driven rollers are configurable between an engaged mode in which they are in contact with the cupola, as well as a non-engaged mode in which they are not generally in contact with the cupola. Interchangeability between modes can be achieve using voltage regulators which can channel energy from the sectioned photovoltaic element or potentially other sources.

In some embodiments the solar tracking system is arrayable to form series and/or parallel systems of multiple units of the solar tracking systems with their associated solar concentrators heating thermal transfer fluid flowing heating elements associated with one or more transport conduits.

BRIEF DESCRIPTION OF THE DRAWINGS

In FIGS. 1, 4, and 5 sets of reflected rays are often illustrated only on one half of the drawings so as to allow alternate illustration upon the other half of the drawings. Various aspects of the present invention are illustrated by way of example, and not by way of limitation, in the accompanying drawings, wherein;

FIG. 1 is a side perspective view of the solar tracking system and associated elements of the present invention, with elements associated with thermal transfer fluid entering and exiting the heating element shown in schematic form with a partial cutaway of the heating element and means to adjust the flow of thermal transfer fluid.

FIG. 4 is a side perspective view emphasizing a dome-like photovoltaic element of the current invention with an exploded view of the top surface of the photovoltaic element.

FIG. 5 is a side perspective view emphasizing a pyramidal photovoltaic element of the current invention with an exploded view of the top surface of the photovoltaic element.

DETAILED DESCRIPTION OF THE INVENTION

Figure 1:
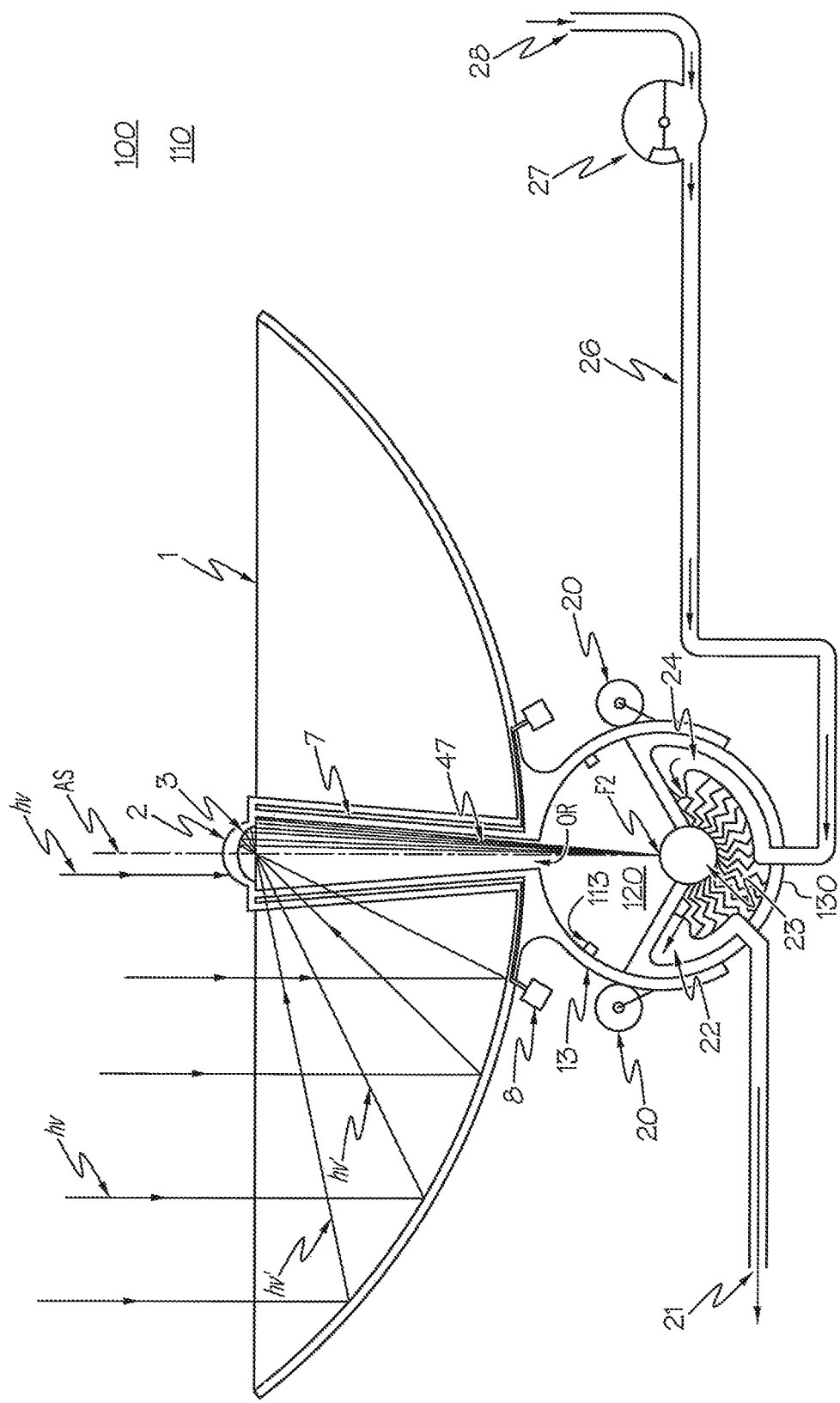

The detailed description set forth below in connection with the appended drawings is intended as a description of various embodiments of the invention and is not intended to represent the only embodiments in which the invention may be practiced. The detailed description includes specific details for the purpose of providing a thorough understanding of the invention. However, it will be apparent to those skilled in the art that the invention may be practiced without these specific details. In some instances, well known structures and components may be shown in block diagram or otherwise abbreviated form in order to avoid obscuring the concepts of the invention.

The following description is provided to enable any person skilled in the art to practice the various embodiments described herein. Various modifications to these embodiments will be readily apparent to those skilled in the art, and the generic principles defined herein may be applied to other embodiments. Thus, the claims are not intended to be limited to the embodiments shown herein, but are to be accorded the full scope consistent with each claim's language, wherein reference to an element in the singular is not intended to mean "one and only one" unless specifically so stated, but rather "one or more." All structural and functional equivalents to the elements of the various embodiments described throughout this disclosure that are known or later come to be known to those of ordinary skill in the art are expressly incorporated herein by reference and are intended to be encompassed by this application. Moreover, nothing disclosed herein is intended to be dedicated to the public regardless of whether such disclosure is explicitly recited in any claim(s). No claim element is to be construed under the provisions of 35 U.S.C. § 112, sixth paragraph, unless the element is expressly recited using the phrase "means for" or, in the case of a method claim, the element is recited using the phrase "step for."

As will be appreciated by one skilled in the art(s), aspects of the present invention may be embodied as a method, system, or structure. The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. Aspects of the invention were chosen and described in order to best explain the principles of the invention and the practical application, and to enable others of ordinary skill in the art to understand the invention for various embodiments with various modifications as are suited to the particular use contemplated.

Some Definitions

"Parabolic" includes "parabolic configurations as well as approximations of parabolic configurations" as no manufactured reflective surface is precisely parabolic and as the approximate parabolic configuration of the current invention includes an opening preferably defined by material near a parabolic origin.

"Elliptical" includes "elliptical configurations as well as approximations of elliptical configurations" as no manufactured reflective surface is precisely elliptical.

"Focus", "Foci", and "Focal Point" refers not only to points but also concepts broad enough to include blur circles/spots, focal clouds, and related terminology, as imprecisely manufactured mirrors and other factors (including limited need for pinpoint precision) prohibit/limit convergence of light rays upon a singular point.

FIG. 1 depicts a solar tracking system 100 for a solar concentrator 110 including a sectioned photovoltaic element 2. Preferably, solar concentrator 110 is double reflecting in nature including an initial parabolic reflecting surface 1, having an axis of symmetry AS, for focusing solar energy rays hv via reflected and converging solar energy rays hv' upon a focal point F1 with said focal point F1 coinciding with/as the primary focal point for a subsequent elliptical reflective surface 3. After passing through first focal point F1 and reflecting off elliptical reflective surface 3, the reflected and converging solar energy rays hv' continue to converge eventually passing through an opening 47 defined by the initial parabolic reflecting surface 1 (preferably near origin OR) as well as a cupola 13 integrated and/or connected to the initial parabolic reflecting surface 1. Said cupola 13 being seated upon a base element 130 containing hot spot 23 preferably comprise of high temperature material. Said seated cupola 13 and base element 130 generally define a heating element 120 that is preferably generally a partially hollowed sphere. Preferably the converging solar energy rays hv converge upon a second focal point F2 that preferably coincides with hot spot 23. The subsequent elliptical reflective surface 3 connected on its reverse to a sectioned photovoltaic element 2 can both be supported by an at least one support element 7 extending from the edge of opening 47.

Preferably section photovoltaic element 2 faces away from origin OR while being upon, but aligned perpendicular to, the axis of symmetry. Each section 35 (See FIGS. 4 and 5 for depictions of sectioned dome-like and pyramidal photovoltaic elements respectively) has an associated measuring means at or running through 66 [shown in abbreviated form in FIGS. 4 and 5] preferably 66 is comprised of electrical conduit running through support element(s) 7 integrated or connected with a voltmeter (not separately depicted) potentially associated with a voltage regulator 8] for measuring which section(s) has/have the highest associated electrical potential difference (e.g., because said section faces the sun more than other sections). Preferably, the sectioned photovoltaic element has four quadrants.

Based upon data from associated measuring means 66, positional adjustment can be made to promote parallelity between the axis of symmetry AS and solar energy rays hv by tilting the section 35 with the highest associated electrical potential difference away from facing the sun as compared to other sections via adjustment means (said adjustment means including one or more adjustable gears or one or more adjustable screws) preferably including driven rollers 20 which can in turn drive cupola 13 along with its integrated/associated/connected initial parabolic reflecting surface 1. One preferred repositioning position configuration has the driven rollers 20 being configurable between an engaged position in contact with cupola 13 and a non-engaged position not in contact with cupola 13—such interchangeability can be useful should one wish to disengage a roller opposite of an engaged roller. Roller engagement/disengagement can be regulated by voltage regulators 8 that can channel energy production from the photovoltaic elements 2 or potentially other sources towards repositioning operations.

Flowing/flowable thermal transfer fluid 28 flows through transport conduit 26 with flow being adjustable via valve regulator 27 before becoming incoming thermal transfer fluid 24 upon entering heating element 120 to be heated by hot spot 23 and surrounding environment and then becoming exiting thermal transfer fluid 22 upon exiting heating element 120 and becoming subsequently transported thermal transfer fluid 21 utilizable for (serial) conversion to heat other materials or to other forms of energy. Heating element 120 may include corrugation, coiling, baffling, mirroring, depressurization, and/or insulation for improved heat transference/preservation qualities; heating element 120 may also include stop nodules to limit the repositioning of cupola 13.

Figure 2:
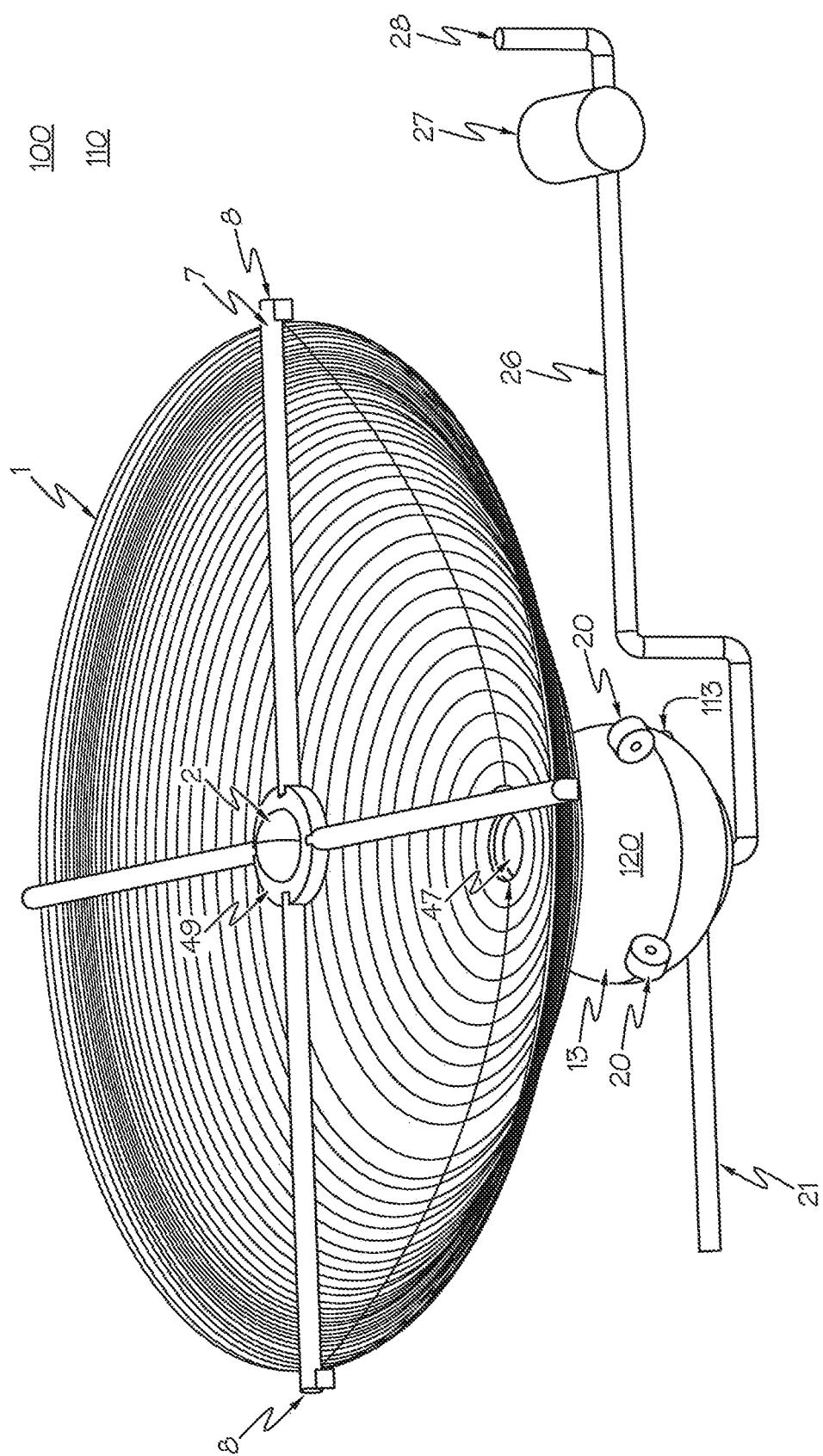
FIG. 2 elevated top perspective view of the solar tracking system and associated elements of the present invention emphasizing support elements extending from the edge of an initial parabolic reflective surface to a subsequent reflective surface and the photovoltaic element.

FIG. 2 is an elevated top perspective view of the solar tracking system 100 for a solar concentrator 110 of the present invention emphasizing support elements 7 configurable to extend from the edge of the initial parabolic reflecting surface 1 to the subsequent elliptical reflecting surface 3 to support said subsequent elliptical reflective surface 3 (potentially via housing 49) and sectioned photovoltaic element 2. In this example, the voltage regulators 8 can be associated with the points where support elements 7 contact the initial parabolic reflective surface 1.

Figure 3:
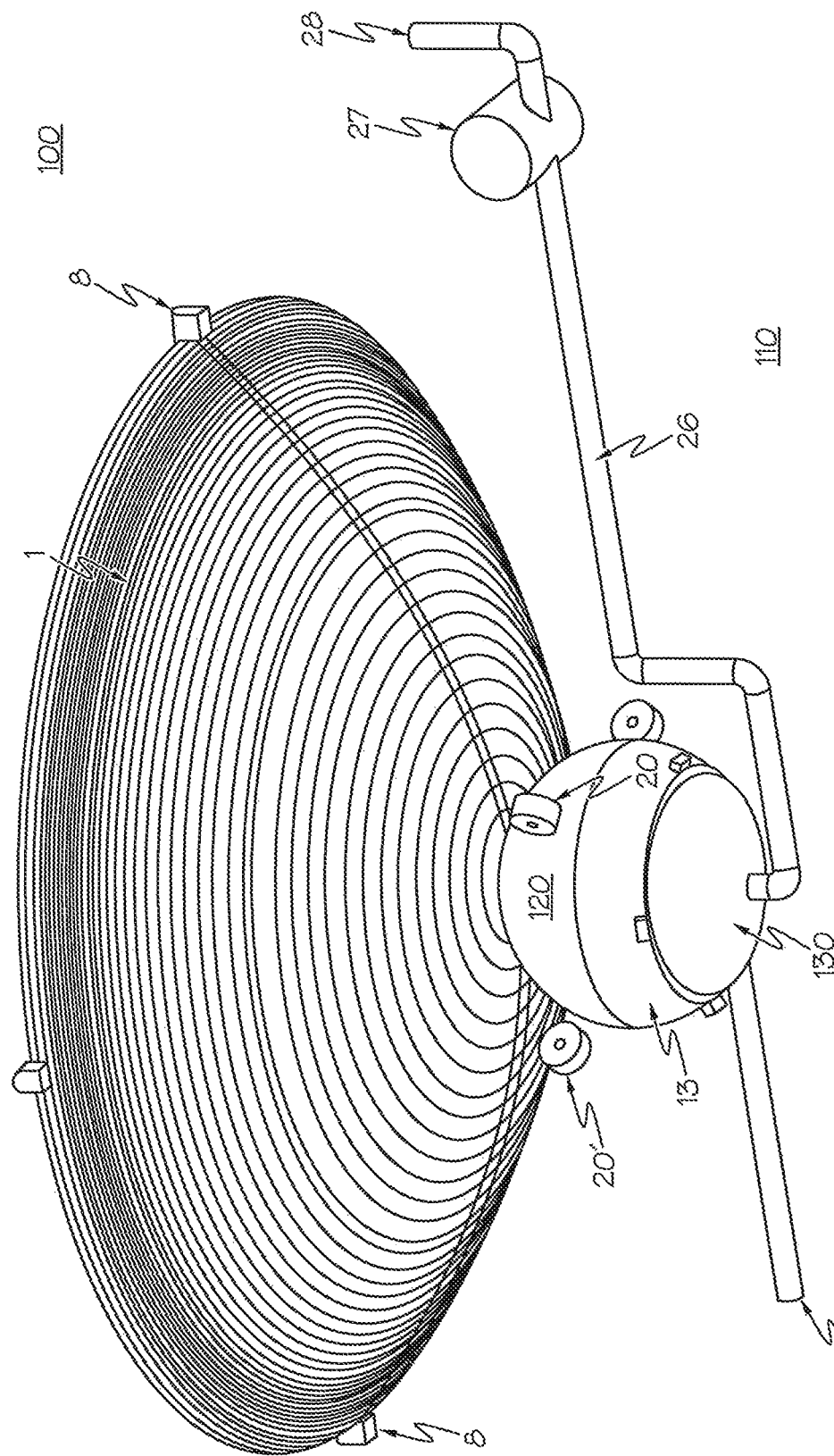
FIG. 3 is an elevated bottom perspective view of the solar tracking system and associated elements of the present invention emphasizing the heating element.

FIG. 3 an elevated bottom perspective view of the solar tracking system 100 for a solar concentrator 110 of the present invention emphasizing heating element 120. FIG. 3 also includes a driven roller 20' (i.e., 29 prime) in non-engaged mode.

Figure 4:
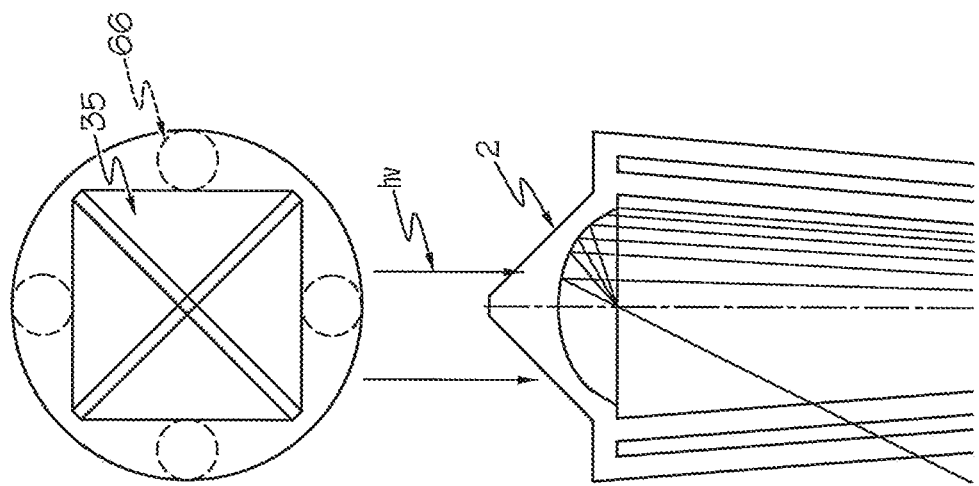

FIG. 4 is a side perspective view emphasizing a dome-like photovoltaic element 2 of the current invention with an inset view of the top surface of the photovoltaic element 2.

Figure 5:
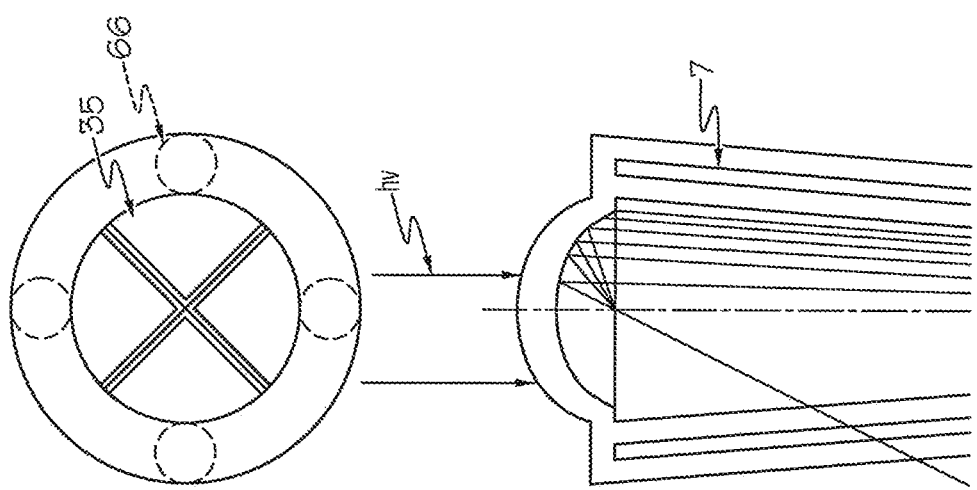

FIG. 5 is a side perspective view emphasizing a pyramidal photovoltaic element 2 of the current invention with an inset view of the top surface of the photovoltaic element 2.

Figure 6:
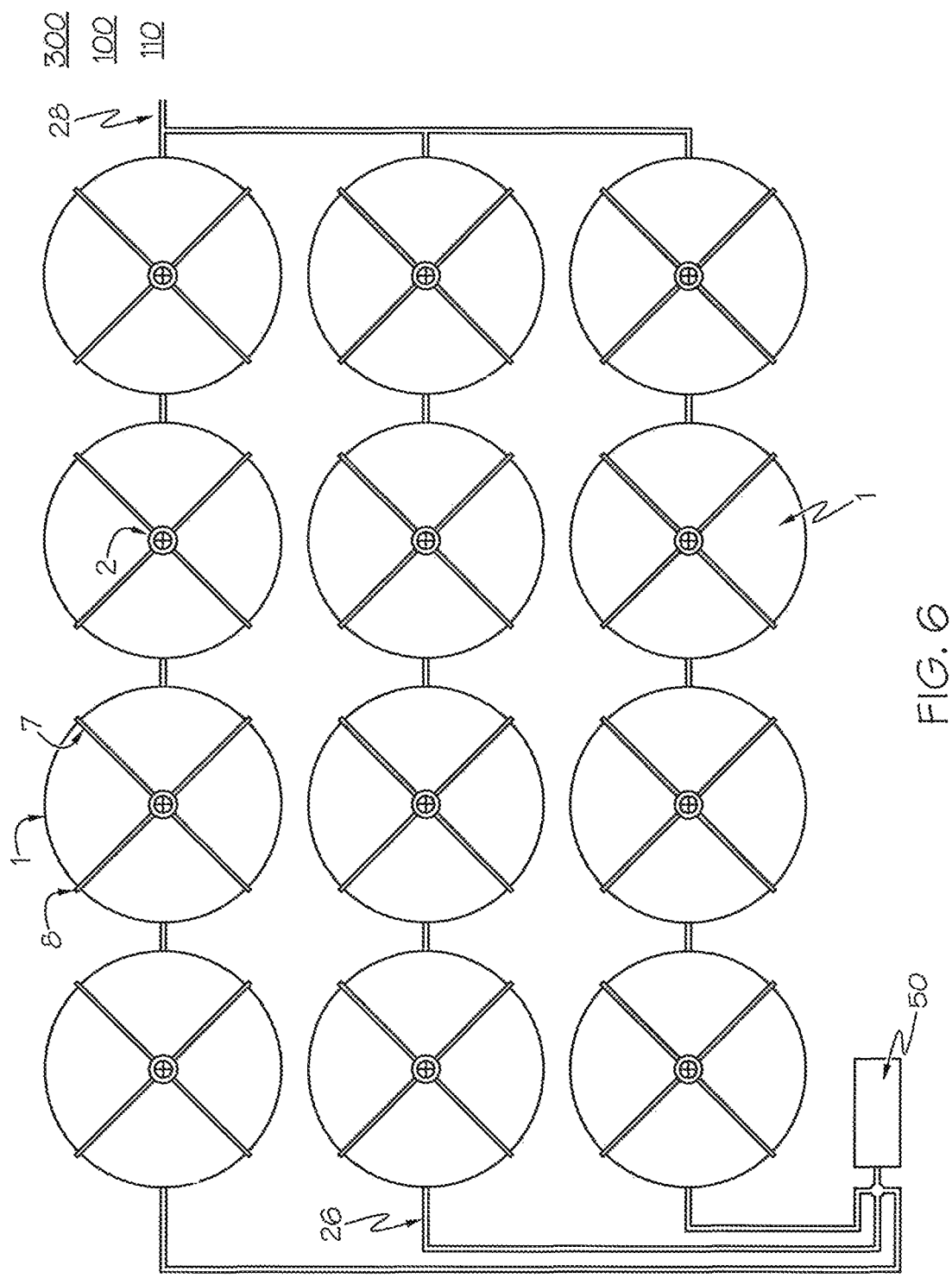
FIG. 6 is an elevated top perspective view of an arrayed arrangement of the solar tracking system and associated elements of the present invention.

FIG. 6 is an elevated top perspective view of an arrayed arrangement 300 of the solar tracking system 100 for a solar concentrator 110 of the present invention powering a turbine 50 for electrical production.

I claim:

1. A solar tracking system for a solar concentrator comprising:
   a sectioned photovoltaic element with plural sections facing away from the origin of an initial parabolic reflective surface while being upon, but aligned perpendicular to, the initial parabolic reflective surface's axis of symmetry;
   said plural sections having respective voltmeters for measuring electrical potential difference associated with light energy conversion to electrical energy;
   means for measuring which section(s) has/have the highest associated electrical potential difference;
   means for adjusting the directionality of the initial parabolic reflective surface to tilt the section(s) of highest associated electrical potential difference away from facing the sun as compared to other sections.

2. The solar tracking system for a solar concentrator of claim 1 further comprising means for performing calculations based upon differences between measured electrical potential differences.

3. The solar tracking system for a solar concentrator of claim 1 further comprising a subsequent reflective surface spatially associated with the focal cloud of the initial parabolic reflective surface.

4. The solar tracking system for a solar concentrator of claim 3 wherein the subsequent reflective surface is elliptical.

5. The solar tracking system for a solar concentrator of claim 4 wherein the focus of the initial parabolic reflective surface is configurable to coincide with the primary focal point of the subsequent elliptical reflective surface.

6. The solar tracking system for a solar concentrator of claim 3 wherein the initial parabolic reflective surface defines an opening through which concentrated solar energy reflected from the subsequent reflective surface passes before heating a thermal transfer fluid flowing through a space defined by a heating element.

7. The solar tracking system for a solar concentrator of claim 6 further comprising at least one support element configured to extend from edge of the opening defined by the initial parabolic reflective surface to support the subsequent reflective surface as well as the section photovoltaic element.

8. The solar tracking system for a solar concentrator of claim 7 wherein the at least one support element further comprises electrical conduit for relaying measurement data from sections of the photovoltaic element and their respective voltmeter.

9. The solar tracking system for a solar concentrator of claim 6 wherein the means for adjusting include plural adjustable rollers configured to contact a cupola seated upon a base element, said cupola and base element helping define a heating element.

10. The solar tracking system for a solar concentrator of claim 9 wherein at least one of the adjustable rollers is configurable between an engaged mode for driving the cupola, thereby repositioning the initial parabolic reflective surface, and a non-engaged mode, said cupola configured to be integral or otherwise move with the initial parabolic reflective surface including the opening defined by the initial parabolic reflective surface such that concentrated solar energy may pass into the heating element.

11. The solar tracking system for a solar concentrator of claim 9 wherein the heating element with integrated cupola and base element define a partially hollowed sphere.

12. The solar tracking system for a solar concentrator of claim 6 wherein the heating element is comprised of high temperature material.

13. The solar tracking system for a solar concentrator of claim 6 wherein the flow of thermal transfer fluid is adjustable.

14. The solar tracking system for a solar concentrator of claim 6 wherein the heating element is configured to include heat transference/preservation via corrugation, coiling, baffling, mirroring, depressurization, and/or insulation.

15. The solar tracking system for a solar concentrator of claim 3 further comprising plural support elements each configured to extend from the edge of the initial parabolic reflective surface to support the subsequent reflective surface as well as the sectioned photovoltaic element.

16. The solar tracking system for a solar concentrator of claim 15 wherein the plural support elements further comprise electrical conduit for relaying measurement data from respective voltmeters.

17. The solar tracking system for a solar concentrator of claim 1 wherein the sectioned photovoltaic element is dome-like in nature.

18. The solar tracking system for a solar concentrator of claim 1 wherein the sectioned photovoltaic element is pyramidal in nature.

19. The solar tracking system for a solar concentrator of claim 1 wherein the means for adjusting include one or more adjustable gears or one or more adjustable screws.

20. The solar tracker for a solar concentrator of claim 1 configurable to an arrayed arrangement.

* * * * *